United States Patent
Afghahi et al.

(10) Patent No.: US 7,715,262 B2
(45) Date of Patent: May 11, 2010

(54) HYBRID DRAM

(75) Inventors: Morteza Cyrus Afghahi, Coto De Caza, CA (US); Esin Terzioglu, Aliso Viejo, CA (US); Gil I. Winograd, Aliso Viejo, CA (US); Melinda L. Miller, Anaheim, CA (US)

(73) Assignee: Novelics, LLC, Aliso Viejo, CA (US)

( * ) Notice: Subject to any disclaimer, the term of this patent is extended or adjusted under 35 U.S.C. 154(b) by 124 days.

(21) Appl. No.: 12/163,989

(22) Filed: Jun. 27, 2008

(65) Prior Publication Data

US 2009/0010041 A1 Jan. 8, 2009

Related U.S. Application Data

(63) Continuation-in-part of application No. 11/845,311, filed on Aug. 27, 2007.

(60) Provisional application No. 60/913,542, filed on Apr. 24, 2007, provisional application No. 60/941,667, filed on Jun. 3, 2007, provisional application No. 60/946,564, filed on Jun. 27, 2007.

(51) Int. Cl.
*G11C 7/02* (2006.01)

(52) U.S. Cl. ............... 365/207; 365/189.05; 365/49.12; 365/149

(58) Field of Classification Search ................. 365/207, 365/49.12, 149
See application file for complete search history.

(56) References Cited

U.S. PATENT DOCUMENTS

| 6,744,676 B2 * | 6/2004 | Leung et al. ........... 365/189.09 |
| 2009/0027984 A1 * | 1/2009 | Mizuno et al. .............. 365/203 |
| 2009/0147596 A1 * | 6/2009 | Shiah .................... 365/189.11 |

* cited by examiner

*Primary Examiner*—Tuan T. Nguyen
(74) *Attorney, Agent, or Firm*—Haynes & Boone, LLP.

(57) ABSTRACT

In one embodiment, a hybrid DRAM is provided that includes: a sense amplifier including a differential amplifier and regenerative latch, wherein the differential amplifier and regenerative latch are constructed using core transistors that have a relatively thin gate oxide; and a plurality of memory cells coupled to the sense amplifier through a pair of bit lines, wherein each memory cell includes an access transistor coupled to a storage cell, the access transistor having a relatively thick gate oxide, whereby the storage capacitor is capable of being charged to a VIO power supply voltage that is greater than a VDD power supply voltage for the core transistors.

1 Claim, 7 Drawing Sheets

HYBRID DRAM

RELATED APPLICATION

This application is a continuation-in-part of U.S. patent application Ser. No. 11/845,311, filed Aug. 27, 2007, which in turn claims the benefit of U.S. Provisional Application No. 60/913,542, filed Apr. 24, 2007 and U.S. Provisional Application No. 60/941,667, filed Jun. 3, 2007. In addition, this application claims the benefit of U.S. Provisional Application No. 60/946,564, filed Jun. 27, 2007.

BACKGROUND OF THE INVENTION

The present invention relates to memories, and more particularly to a dynamic random access memory (DRAM) architecture.

Because a DRAM memory cell includes just a single access transistor and a storage capacitor, DRAM offers dramatic density advantages over static random access memory (SRAM), which typically requires a six transistor (6-T) memory cell. In contrast to SRAM, a DRAM cell will only change the voltage on its corresponding bit line slightly during read operations. Having been coupled to the bit line, the storage capacitor in a DRAM cell must be then be restored after a read operation. Thus, DRAM sense amplifiers require a regenerative latching ability to drive the bit line "full rail" after a read operation. If the sense amplifier determines that the storage capacitor was charged to VDD, the bit line is then driven to VDD to restore the charge on the storage capacitor. On the other hand, if the sense amplifier determines that the storage capacitor was not charged, the bit line is grounded to discharge the storage capacitor. Moreover, the charge on DRAM storage capacitors continually leaks away, requiring constant refreshing. SRAM cells require no such refreshing. In addition, because the 6-T SRAM cell can drive its value onto a bit line during read operations, SRAM is generally substantially faster than DRAM.

As a result of the density vs. speed advantages of SRAM and DRAM, SRAM is faster but more expensive and thus reserved for more time-critical operations such as a microprocessor's cache. To reduce costs, the remaining RAM for a microprocessor is then typically implemented as DRAM. However, because DRAM operation speed is constantly being improved, the use of embedded DRAM in integrated circuits is becoming more popular in high-performance applications that traditionally demanded embedded SRAM. Nevertheless, the choice between DRAM and SRAM is often guided by the density vs. speed tradeoffs discussed above. Accordingly, designers strive to increase DRAM density and speed.

The challenges to increasing DRAM density may be better appreciated through discussion of a conventional DRAM 100 illustrated in FIG. 1. A word line WL0 controls the gate of an access NMOS transistor M0 whose drain couples to a bit line Bx. The source of access transistor M0 couples to a storage capacitor C0. Thus, access transistor M0 and storage capacitor C0 form a DRAM memory cell that is accessed by raising the voltage on word line WL0. In response to this voltage rise, any charge on capacitor C0 couples to bit line Bx. A sense amplifier reads the contents of the accessed memory cell by detecting a resulting voltage change on bit line Bx.

The sense amplifier detects the voltage change by comparing the voltage on bit line Bx to a neighboring bit line such as a bit line B. Before this comparison is made, bit lines Bx and B are pre-charged to a voltage such as VDD/2 by pre-charge circuitry. If the comparison indicates that bit line Bx is higher in voltage than bit line B, downstream decoding logic (not illustrated) will assume that the storage capacitor C0 had previously been charged to a supply voltage such as VDD. If the comparison indicates that bit line B is higher in voltage than bit line Bx, the decoding logic will assume that storage capacitor C0 had previously been discharged. In this fashion, a decision is made as to the binary contents of the memory cell. Having read the contents of the memory cell, the sense amplifier will restore the memory cell using a regenerative latch. An analogous access may be made to a memory cell comprised of access transistor M1 and a storage capacitor C1 by raising a word line WL1, and so on.

Each bit line has an inherent capacitance that is typically an order of magnitude greater than the capacitance of the storage capacitors. This difference in capacitance is exacerbated as the number of memory cells accessible by a sense amplifier is increased. For example, should DRAM 100 be implemented with an integer number "N" of word lines, the length of the bit lines will have to double the number of bit lines is increased to 2*N (assuming the same semiconductor process dimensions in both cases). The bit line capacitance will thus double as well, thereby decreasing the voltage change when a memory cell is accessed. As a result, the maximum number of memory cell rows per sense amplifier in a conventional trench-capacitor DRAM is limited to, for example, 512 rows per sense amplifier. This maximum number is considerably lower in embedded DRAMs that need to be compatible with standard semiconductor manufacturing processes such as CMOS. In such embedded DRAMs, the storage cell cannot be formed using a trench capacitor such that the amount of charge that may be stored in the storage cell is reduced. For example, if an embedded DRAM has its storage cells implemented using transistors, the maximum number is typically around 8 to 16 rows. Thus, embedded DRAMs are particularly sensitive to bit-line-capacitance-density-limiting-issues.

Another hindrance to increasing density is the capacitance of the access transistor. For example, as discussed with regard to FIG. 1, access transistors conduct by having their gate voltages activated by a corresponding word line. However, each access transistor is not a perfect switch for such coupling as it has an inherent capacitance between its gate and its drain/source terminals. Because of this capacitance, access transistor M0 will tend to raise the voltage on bit line bx in response to an increase of its gate voltage. As a result, a memory cell that was storing a logical zero may be decoded incorrectly as having stored a logical one (assuming logic high operation). As circuit dimensions are pushed into the deep sub-micron regime, such capacitive coupling exacerbates the density issues discussed with regard to bit line capacitance.

Another factor in increasing density is the non-ideal characteristic of sense amplifiers. A conventional sense amplifier 200 is illustrated in FIG. 2. This sense amplifier includes a differential amplifier 205 that compares a voltage P derived from bit line B (FIG. 1) at its positive input to a voltage N derived from bit line Bx (FIG. 1) at its negative input. If voltage P is higher than the voltage N, the voltage difference is amplified onto differential outputs P0 and N0 by the differential amplifier's gain. A regenerative latch 210 would then drive voltage P full rail to VDD and pull voltage N to ground. Conversely, if voltage N is higher than voltage P, the regenerative latch drives voltage N full rail to VDD and pulls voltage P to ground.

Should both differential inputs, however, be at the same voltage (such as a pre-charge voltage VDD/2), the regenerative latch operation just described may not take place correctly. Instead, because of offset imperfections in the differential amplifier, P0 (for example) output may be driven higher than N0 despite the equal voltages at the inputs. In turn, this offset limits the sensitivity of the sense amplifier operation. For example, suppose bit line B should be higher in voltage than bit line Bx during a read operation. If the storage capacitance is too small with regard to other effects such as bit line capacitance, the offset within the differential amplifier may drive the regenerative latch to pull output N full rail and ground output P, leading to an erroneous reading.

As discussed above, the storage capacitance vs. bit line capacitance is a limiting factor for DRAM density. By increasing the storage capacitance, a sense amplifier can better decide what binary contents are being stored. However, the increased storage capacitance generally leads to increased memory cell size, thereby diminishing density.

SUMMARY

This section summarizes some features of the invention. Other features are described in the subsequent sections.

In accordance with an embodiment of the invention, a hybrid DRAM is provided that includes: a sense amplifier including a differential amplifier and regenerative latch, wherein the differential amplifier and regenerative latch are constructed using core transistors that have a relatively thin gate oxide; and a plurality of memory cells coupled to the sense amplifier through a pair of bit lines, wherein each memory cell includes an access transistor coupled to a storage cell, the access transistor having a relatively thick gate oxide, whereby the storage capacitor is capable of being charged to a VIO power supply voltage that is greater than a VDD power supply voltage for the core transistors.

The invention is not limited to the features and advantages described above. Other features are described below. The invention is defined by the appended claims.

DETAILED DESCRIPTION

Reference will now be made in detail to one or more embodiments of the invention. While the invention will be described with respect to these embodiments, it should be understood that the invention is not limited to any particular embodiment. On the contrary, the invention includes alternatives, modifications, and equivalents as may come within the spirit and scope of the appended claims. Furthermore, in the following description, numerous specific details are set forth to provide a thorough understanding of the invention. The invention may be practiced without some or all of these specific details. In other instances, well-known structures and principles of operation have not been described in detail to avoid obscuring the invention.

Figure 3:
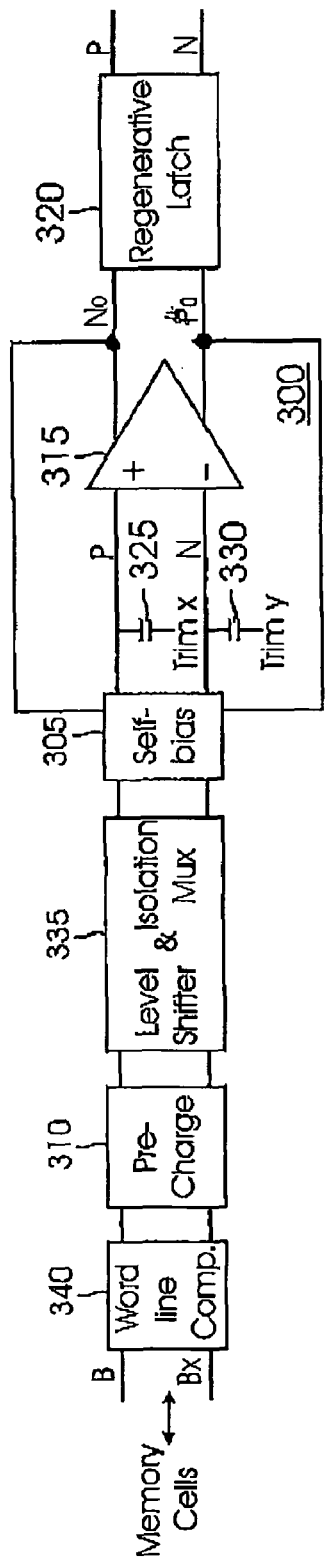
FIG. 3 illustrates a sense amplifier incorporating a self-bias generation circuit and a hybrid core transistor/IO transistor architecture in accordance with an embodiment of the invention.

Turning now to FIG. 3, an improved sense amplifier 300 includes a self-bias generation circuit 305. The self-bias generation circuit complements the operation of a pre-charge circuit 310 that operates to charge a bit line B and a bit line Bx to a desired pre-charge voltage prior to a read operation. Should the pre-charge circuit 310 operate without the self-bias generation circuit, a differential amplifier 315 will, due to its offset, provide some voltage difference between a positive output P0 and a negative output N0 even though bit lines B and Bx are at the same voltage. To cancel this offset voltage, the voltages of bit lines B and Bx may be adjusted in a complementary fashion from the pre-charge voltage using negative feedback. In this manner, the differential amplifier may then immediately respond to any additional changes in the voltages of bit lines B and Bx due to a read operation by amplifying the additional change according to its internal gain. This amplified change is then applied across outputs P0 and N0 so that a regenerative latch 320 may drive its outputs P and N accordingly. Outputs P and N then drive the bit lines so that the appropriate voltage is restored on the storage capacitor that was just accessed.

Figure 4:
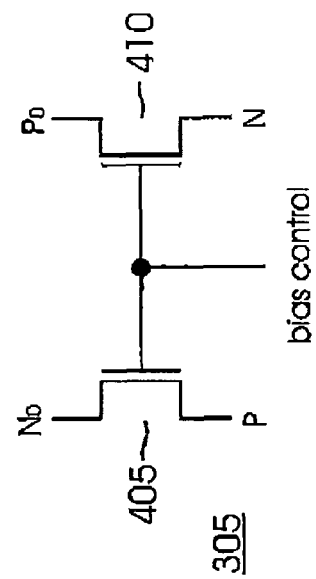
FIG. 4 illustrates a self-bias generation circuit in accordance with an embodiment of the invention.

An exemplary self-bias generation circuit 305 is illustrated in FIG. 4. Operation of circuit 305 may be isolated from the pre-charge operation. In other words, the pre-charge circuit of FIG. 3 charges the bit lines B and Bx to a suitable voltage and then lets these lines float while the self-bias generation circuit operates to cancel the offset in the differential amplifier. Similarly, the self-bias generation circuit operation may be isolated from the voltage differences between the bit lines resulting from a memory cell being accessed—without such isolation, the voltage difference from the memory cell being accessed would be treated as an offset by the self-bias generation circuit and thereby erased. As seen in FIG. 4, self-bias generation circuit 305 comprises feedback NMOS transistors 405 and 410 having gates driven by a bias control signal. When the bias control signal is asserted (pulled high), feedback transistor 405 becomes conductive such that the voltage of input P equals the voltage of output N0. Similarly, feedback transistor 410 becomes conductive such that the voltage of input N equals the voltage of output P0. It may be seen that the resulting negative feedback through the differential amplifier dramatically reduces the effects of the voltage offset. For example, if the voltage offset is represented by a voltage difference ΔV, the relationship between the input and output voltages is given by:

$$G(V_P - V_N) + \Delta V = V_{P0} - V_{N0}$$

where G is the gain of the differential amplifier, $V_P$ and $V_N$ are the voltages at the input nodes P and N, respectively, and $V_{P0}$ and $V_{N0}$ are the voltages at the output nodes P0 and N0, respectively. Should $V_{P0}$ equal $V_N$ and $V_{N0}$ equal $V_P$ such as when the bias control signal is asserted, the preceding equation leads to:

$$\Delta V/(G+1) = -(V_P - V_N)$$

As a result, the offset is reduced by the factor (G+1). Because the open loop gain G is large for a differential amplifier, the effect of the offset voltage is virtually eliminated. It will be appreciated that other topologies may be used for the self-bias generation circuit to eliminate the offset effect in this fashion.

Figure 5:
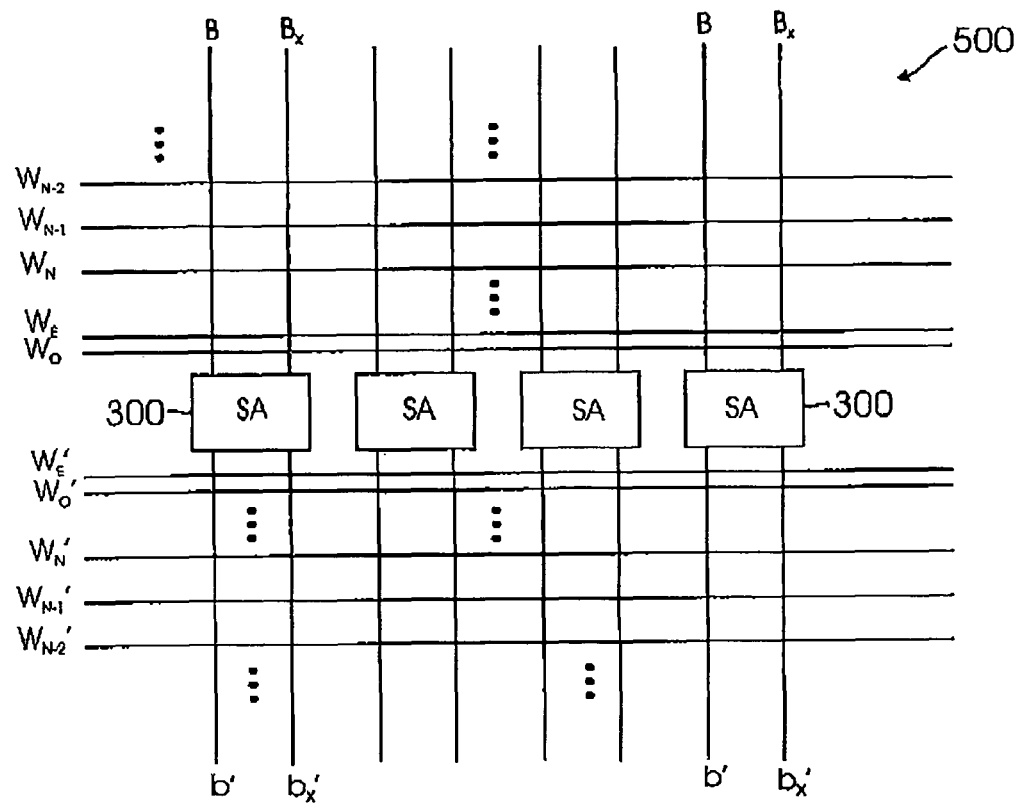
FIG. 5 illustrates a DRAM including sense amplifier as discussed with regard to FIG. 3.

Turning now to FIG. 5, a DRAM 500 that includes a plurality of sense amplifiers 300 is illustrated. To increase density, each sense amplifier 300 senses the charge in memory cells associated with two sets of word lines: a first set of N word lines W and a set of N word lines W'. For illustration clarity, only 3 word lines for each set are shown in FIG. 5. For similar illustration clarity, it may thus be seen that, with the exception of differential amplifier 315 and regenerative latch 320, just one ½ of the remaining circuitry in sense amplifier 300 is illustrated in FIG. 3. This remaining circuitry is repeated a second time so that the resulting sense amplifier may service the two sets of word lines. Referring again to FIG. 5, a memory cell (discussed further with regard to FIG. 10) formed from a storage capacitor and a corresponding access transistor resides at the intersection of each word line and bit line.

A hybrid architecture for DRAM 500 will now be discussed. As known in the CMOS arts, a CMOS circuit may include input/output (I/O) transistors and core transistors. The I/O transistors are more robust than the core transistors so as to handle the relatively large voltages used in conventional I/O protocols. In contrast, the core transistors are smaller and cannot be subjected to the I/O voltages. Instead, the core transistors are powered using a core voltage that is lower than the I/O voltage used in the I/O transistors. For example, in modern high-density CMOS, the core voltage (which will be referred to herein as VDD) may be just 1V whereas the I/O voltage (which will be referred to herein as VIO) may be 2.5V. Advantageously, DRAM 500 is constructed from a mix of I/O and core transistors to maximize density and performance. The memory cells (discussed with regard to FIG. 10) are formed using an I/O process whereas differential amplifier and regenerative latch are constructed using core devices. Because I/O transistors have a higher threshold voltage (e.g., 0.5V to 0.7V as compared to 0.35V to 0.5V for core devices), leakage from the storage capacitors through the corresponding access transistors is reduced. In addition, the amount of charge Q that can be loaded into the storage capacitors is maximized. Density is enhanced, however, because differential amplifier 315 and regenerative latch 320 may be constructed using core transistors. Regenerative latch 320 may thus drive the voltages $V_P$ and $V_N$ to just a maximum voltage VDD. As will be explained further herein, a level-shifter circuit and isolation multiplexer 335 (FIG. 3) boosts the write-back voltages from the regenerative latch to VIO levels. Because pre-charge circuit 310 is charging bit lines that will be sensed by a core-voltage-powered sense amplifier, a suitable pre-charge voltage for the bit lines to be sensed equals VDD/2. Advantageously, the storage capacitors may then be charged with IO level voltages yet the sense amplifier operates off of core voltages. In this fashion, power consumption by the sense amplifier is significantly reduced while leakage currents from the storage capacitors are minimized. To further minimize leakage from memory cells corresponding to inactive word lines (the remaining word lines besides the word line whose voltage is raised to access a corresponding memory cell), the inactive word line voltages may be driven to negative values through the use of a charge pump (not illustrated).

Although the sense amplifier discussed with regard to FIG. 3 increases the sensitivity of its differential amplifier, the resulting biases may affect the margins regarding whether an accessed memory cell was storing a "1" or a "0." In other words, the negative feedback through the self-bias circuit will pull the bit line voltages slightly away from their pre-charge voltage. For example, a suitable pre-charge voltage is VDD/2. For an ideal core-voltage-powered sense amplifier, such a pre-charge voltage neither favors a logical 1 nor a logical zero decision and is thus theoretically ideal. The self-bias generation circuit described herein will pull the bit lines away from this ideal bias point such that a logical 0 may be favored over a logical 1 decision (or vice versa). In general, the ideal bias point for a given differential amplifier will depend upon the relative strengths of its PMOS and NMOS transistors. In turn, these relative strengths are affected by the particular semiconductor process corner used to manufacture the transistors. A customer of a semiconductor foundry can never guarantee, a priori, what particular process corner will be used to manufacture a given batch of wafers. Thus, the relative margin between logical 0 and logical 1 decisions for a sense amplifier that includes a self-bias generation circuit may also be unpredictable.

As a result, although a sense amplifier with self-bias generation advantageously is more sensitive to the voltage differences produced by accessing a memory cell, the self-bias generation may push the sense amplifier into having less than ideal margins between logical 0 and logical 1 decisions. Referring again to FIG. 3, bit line B may be biased by a trim circuit such as a trim capacitor 325 charged by an adaptive signal (trimx) such that a less-than-ideal margin may be optimized. Similarly, bit line Bx may include a trim capacitor 330 charged by an adaptive signal (trimy) to also optimize the margin. Upon manufacture of a DRAM having sense amplifiers with self-bias generation, a user may test the bit error rate for storing the binary states (logical 0 vs. logical 1). Should the bit error rate for storing, for example, a logical 0 in each memory cell be higher than when a logical 1 is stored, the adaptive signals trimx and trimy may be adjusted such that the bit error rate is minimized for both decisions. During idle states, the adaptive trim signals are not asserted. The adaptive trim signals may range through a binary-weighted range of values. Upon manufacture, the appropriate trim signal values to be applied after self-bias generation may be "burned" into the circuit using, for example, fuses or non-volatile memory. It will be appreciated that a trim circuit may be used in DRAMs without self-bias cancellation and in other memories such as SRAM or flash. For example, the trim circuit may comprise an adjustable current source should a memory use current sensing to make bit decisions. Regardless of the type of bias adjustment provided by a trim circuit coupled to a bit line (such as charge from a capacitor or current from a current source), the trim circuit may be adjusted by a controller depending upon the observed bit error rate to enhance performance. Moreover, a trim circuit may be used during debugging to test memory performance in response to trim-circuit-provided bit line bias adjustments.

Figure 1:
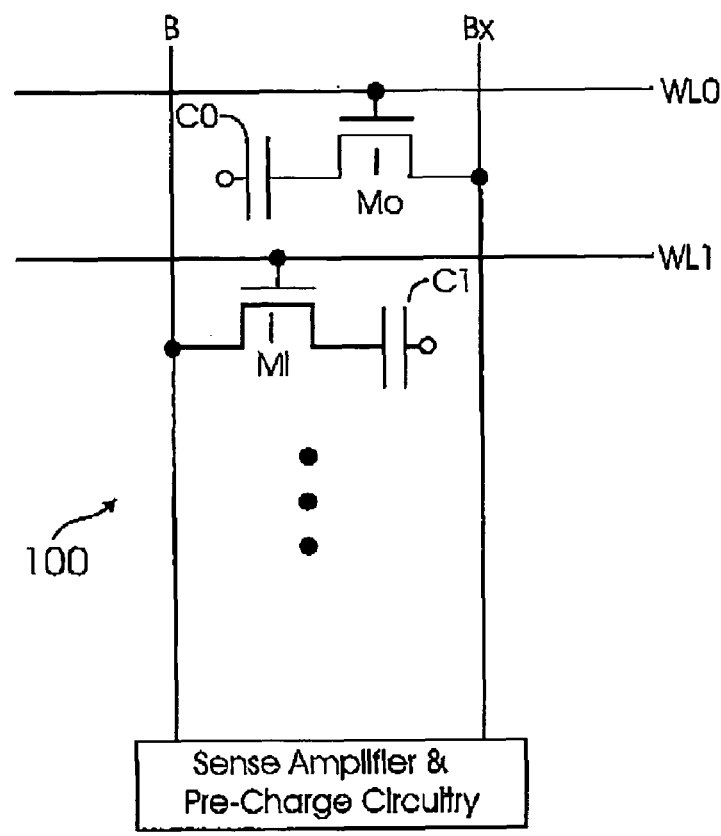
FIG. 1 illustrates a conventional DRAM.
Figure 2:
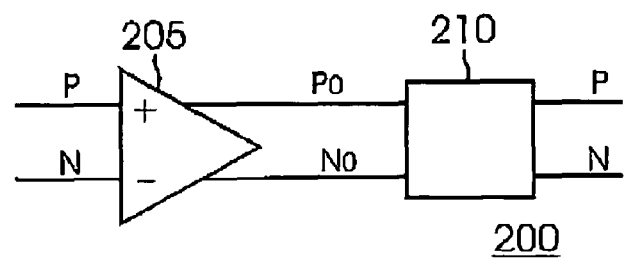
FIG. 2 illustrates a conventional sense amplifier.
Figure 6:
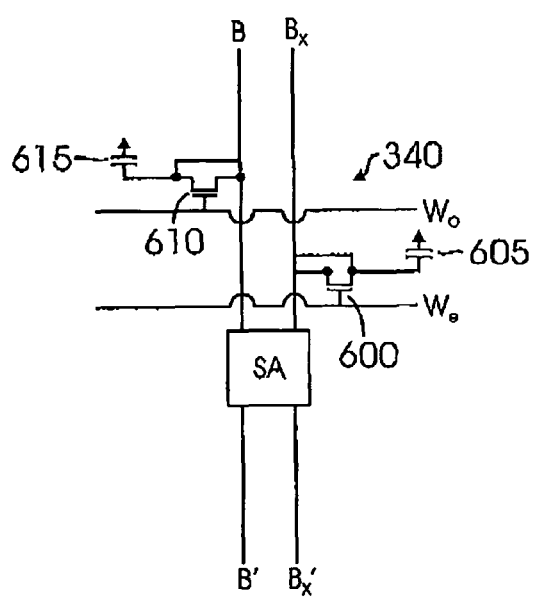
FIG. 6 illustrates a word line compensation circuit for the sense amplifier of FIG. 3.

As discussed with regard to FIG. 1, a memory cell is accessed by raising the corresponding word line so that the access transistor couples the storage capacitor to its bit line. As the circuit dimensions are pushed ever smaller, the length of the bit line will also shrink. In turn, this reduces the overall capacitance of the bit line such that the capacitance of the access transistor may become relatively appreciable compared to the bit line capacitance. Thus, when the word line voltage is raised, the bit line voltage will also increase. This access-transistor-coupled voltage increase may lead to undesirable bit error rates. Thus, sense amplifier 300 may include a word line compensation circuit 340 (FIG. 3). Turning now to FIG. 6, word line compensation circuit 340 is further illustrated. As seen in FIG. 6, each bit line may be associated with an extra word line. Suppose a memory cell that couples to bit line B is to be read/refreshed. Although the sense amplifier implements offset bias cancellation, bit error rates may be affected through an access-transistor-capacitively-coupled voltage increase on bit line B when the corresponding word line voltage is raised. To prevent such a voltage difference between bit line B and bit line Bx, a replica word line (denoted as word line even (We)) has its voltage increased to the same amount as the word line whenever a memory cell coupling to bit line B is accessed. Similarly, another replica word line (denoted as word line odd (Wo)) is increased whenever a memory cell coupling to bit line Bx is accessed.

Each replica word line couples to a replica access transistor and a replica storage capacitor that are matched to the actual access transistors and storage capacitors. For example, word line We drives the gate of a replica access transistor 600 so that a replica storage capacitor 605 will be coupled to bit line Bx. To prevent stray charge from storage capacitor 605 undesirably affecting the voltage on bit line Bx, it has a terminal shorted to bit line Bx. Similarly, word line Wo drives the gate of a replica access transistor 610 so that a replica storage capacitor 615 is coupled to bit line B (for illustration clarity the replica word lines and associated circuitry for bit lines B' and Bx' are not shown). Consider the advantages of such a memory architecture—whatever access-transistor-capacitively-induced voltage increase that occurs when memory cells coupled to bit line B are being accessed, the same voltage increase will occur on bit line Bx. Similarly, if memory cells coupled to bit line Bx are being accessed, any access-transistor-capacitively-induced voltage increase on bit line Bx will also occur on bit line B. In this fashion, no voltage difference will be induced between the sensed bit lines despite the corresponding access transistors being driven on. Although the voltage difference is thus cancelled, both bit line voltages are now slightly increased in voltage from the offset-cancelling levels induced by the self-bias circuit. To bring the bit line voltage levels back to this ideal level, feedback transistors 405 and 410 (FIG. 4) in the self-bias generation circuit may be twice as large as the access transistors. Thus, as feedback transistors 405 and 410 are turned off during sensing, they will each have a capacitive coupling to the bit lines that matches that of the access transistors. In this fashion, as the gate voltages on feedback transistors 405 and 410 are grounded, the resulting capacitive coupling from these transistors will park the bit line voltages at their ideal (offset cancelling) levels.

Figure 7:
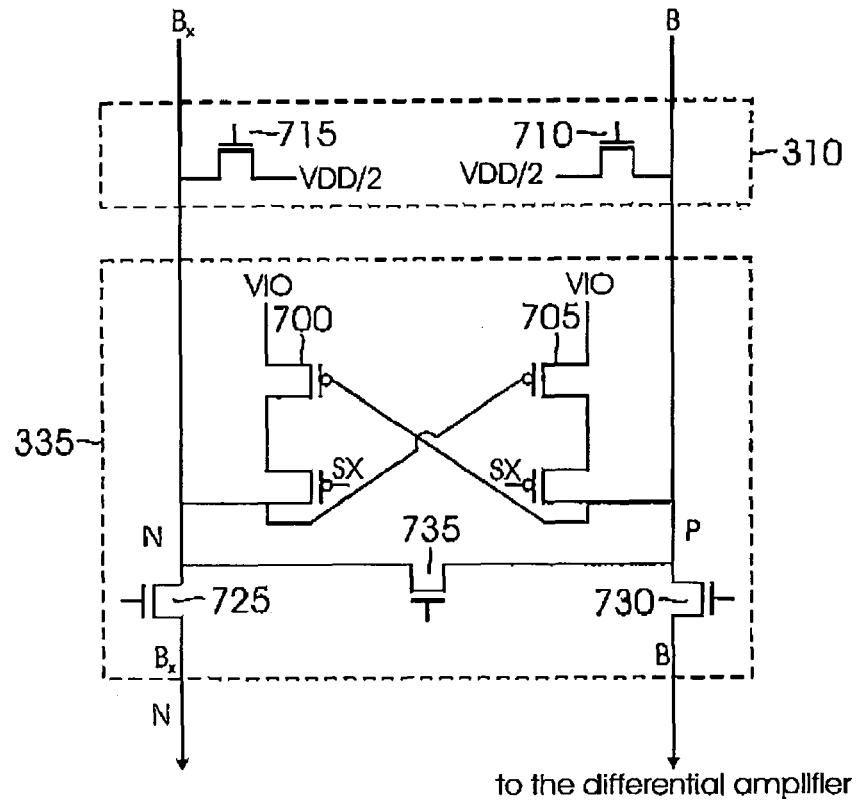
FIG. 7 illustrates a pre-charging circuit and a level-shifter and isolation multiplexer circuit for the sense amplifier of FIG. 3.

After processing the voltages on nodes P and N, the bit lines will be pulled full rail (in core voltage VDD) in a complementary fashion through the regenerative latching action of regenerative latch 320 (FIG. 3). To shift this core voltage to an IO level, level shifter and isolation multiplexer 335 may include cross-coupled PMOS transistors 700 and 705 as illustrated in FIG. 7. Both transistors 700 and 705 couple between their respective bit lines and an I/O power supply providing an I/O power supply voltage VIO. Suppose a memory cell coupled to bit line B has been accessed that stored a logical "1" such that the regenerative latch drives voltage $V_P$ high and voltage $V_N$ low. The high voltage on bit line B will switch transistor 700 to be off such that bit line Bx is isolated from voltage VIO. Conversely, the low voltage on bit line Bx will switch transistor 705 on such that the voltage on bit line B is raised to VIO. The corresponding memory cell on bit line B will thus be charged to VIO. On the other hand, suppose this memory cell was accessed but was storing a logical "0." The regenerative latch will then drive voltage $V_P$ low and voltage $V_N$ high. Transistor 700 will thus conduct so as to charge the voltage on bit line Bx to VIO whereas transistor 705 will be off so that bit line B remains grounded. To minimize leakage and coupling effects, each transistor 700 and 705 may couple to their respective bit lines series with another PMOS transistor controlled by a gate voltage sx that is pulled low after memory cell access.

Pre-charge circuit 310 may comprise NMOS transistors 710 and 715 that couple between a power supply of voltage VDD/2 and their respective bit lines. Prior to memory cell access, a controller (not illustrated) will drive transistors 710 and 715 on so that the bit line voltages are raised to VDD/2. A balance transistor 735 also conducts to ensure voltage equality between the bit lines. Transistors 710, 715, and 735 are then turned off so that the bit lines float during the self-bias cancellation process discussed previously. During this process, isolation transistors 725 and 730 are turned on to couple the respective bit lines to the self-bias generation circuit. After the offset bias is removed and the feedback transistors (FIG. 4) turned off, the isolation transistors must of course stay on so that the memory cell being accessed may be decoded by the sense amplifier. Because of the level-shifting occurring with regard to transistors 700 and 705, the isolation transistors are driven by a gate voltage of (VDD+$V_{threshold}$). In this fashion, the voltage on the sources of these transistors may be at VIO while the drains may be at just VDD. The transistors shown in FIG. 7 are all I/O transistors because of the IO level voltage that is being impressed on the bit lines. As discussed with regard to FIG. 5, the sense amplifiers may process multiple sets of word lines and their corresponding memory cells. Thus, transistors 725 and 730 may be considered to have a multiplexer action since either bit lines B and Bx or bit lines B' and Bx' are being selected through level shifter and isolation multiplexer circuits 735.

Figure 8:
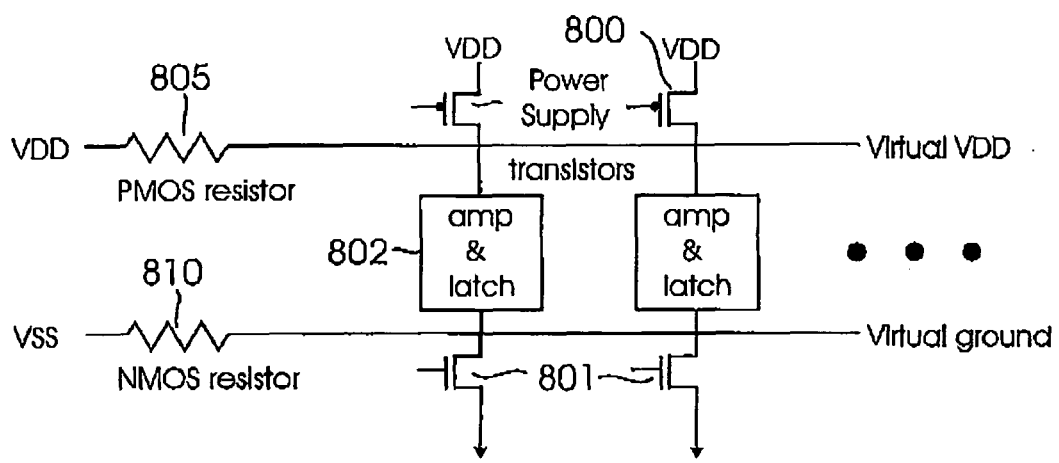
FIG. 8 illustrates the biasing of sense amplifiers during idle periods in accordance with an embodiment of the invention.

After sensing, sense amplifier 300 may be switched off as illustrated in FIG. 8. A controller (not illustrated) first switches off power supply transistors 800 that provide the power supply voltage VDD to the differential amplifiers and regenerative latches 802. A corresponding ground transistor 801 couples these circuits to ground. Balance transistor 735 is left on for a period of time after this switching of transistors 800. Thus, the bit lines will fall to a voltage of approximately VDD/2 at this time. The feedback and ground transistors are also left on during this period. After a suitable period of time, the feedback transistors (FIG. 4), the balance transistor, and the ground transistors are switched off. At this point, the sense amplifier will have operated in a sub-threshold mode to drive the bit lines close to their offset-bias-cancelled voltages. To keep the bit line voltages at this desirable voltage level, a PMOS resistor 805 couples a VDD power supply voltage to the drains of the power supply transistors. The drains are thus maintained as a virtual VDD power supply node. Similarly, an NMOS resistor 810 couples a ground node to the drains of ground transistors 801 so that these drains are maintained as a virtual ground. Each resistor may be constructed from a series of small channel devices. Thus, the NMOS and PMOS resistors mimic the PMOS and NMOS relative strengths within circuits 802 resulting from the particular semiconductor manufacturing process corner that was implemented at the foundry. In other words, if these relative strengths are such that the virtual ground should be slightly higher than it otherwise would be, the NMOS/PMOS resistor values will be such that the virtual ground is maintained at this desired level. Conversely, if these strengths are such that the virtual power supply node should be slightly higher than it otherwise would be, it will be maintained at this level. The end result is that the PMOS and NMOS resistors inject the appropriate amount of leakage current to maintain the bit line voltages relatively close to their offset-bias-cancelled levels. In this fashion, the sense amplifier may "wake up" very quickly to sense a memory cell's content after being idle.

The combination of the offset bias cancellation and word line compensation discussed above leads to a very sensitive sense amplifier design. Because the sense amplifier may thus service more word line rows, density is dramatically improved. Moreover, the use of I/O voltages in the memory cells (which provides more charge to drive the bit lines) and also the bit line biasing during idle periods discussed with regard to FIG. 8 provides a relatively speedy memory operation. In this fashion, the resulting DRAM may be denoted as a "one-transistor" SRAM in that it relatively fast yet uses just one transistor per memory cell.

Figure 9:
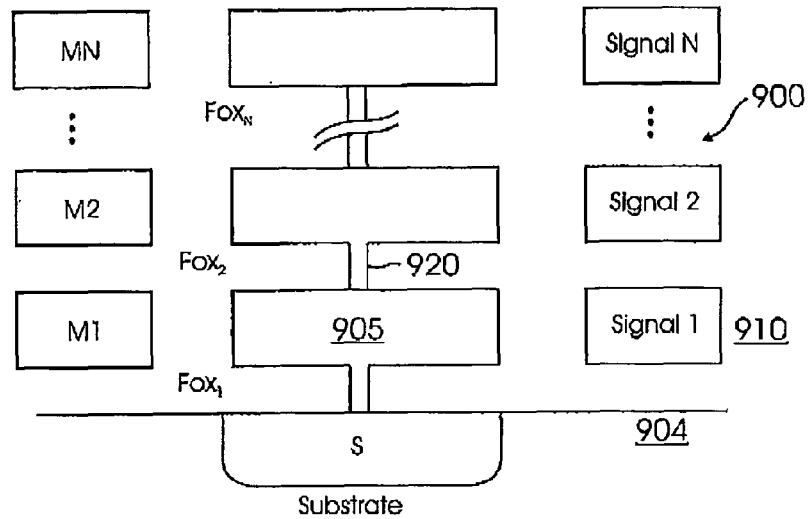
FIG. 9 is a cross-sectional view of a metal-layer storage capacitor for the DRAM of FIG. 5.

To keep the memory cells compatible with CMOS processes, the storage capacitors discussed with regard to FIG. 1 may be implemented in semiconductor manufacturing process metal layers. Alternatively, the storage cells may comprise storage transistors. Because metal-layer capacitors offer much greater capacitances and density at advanced process dimensions, the following discussion will assume without loss of generality that the memory cells are implemented using metal-layer-implemented storage capacitors. Turning now to FIG. 9, each metal-layer storage capacitor 900 may be constructed using the conventional metal layers available in CMOS and other semiconductor processes. The number of metal layers available depends upon the particular semiconductor process being implemented and is represented by an integer N. Thus, the metal layers range from a first metal layer M1 separated from a substrate 904 by a first field oxide layer FOX1 to a final metal layer MN separated from an underlying metal layer (not illustrated) by a field oxide layer FOXN.

Figure 10:
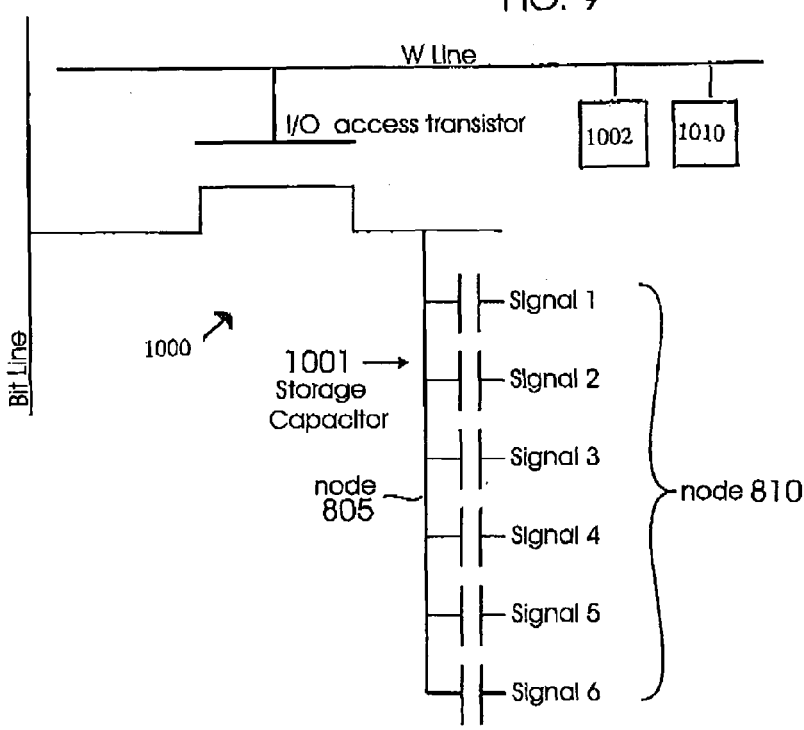
FIG. 10 is a schematic view of the memory cell storage capacitor of FIG. 9.
Figure 11:
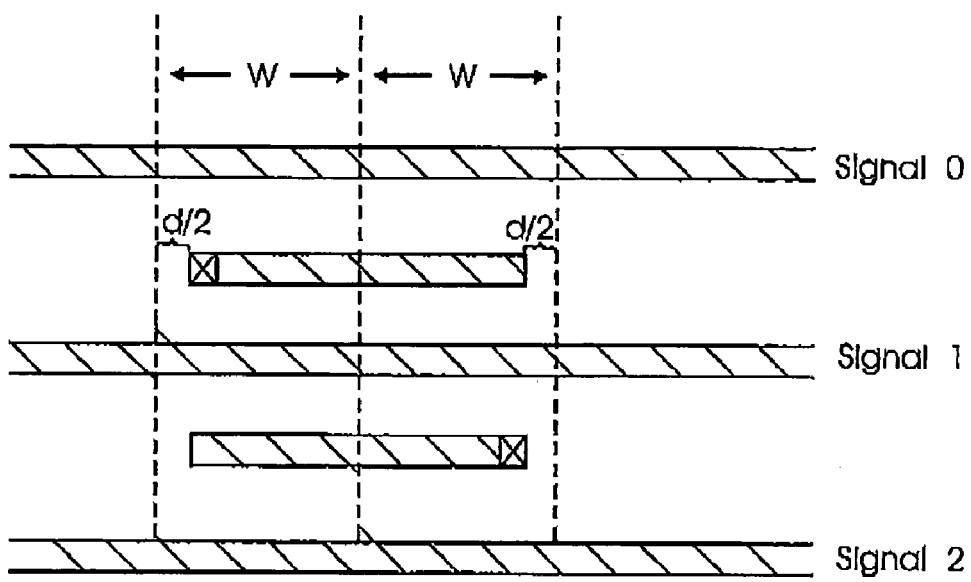
FIG. 11 is a plan view of a metal layer layout for the metal-layer storage capacitor of FIG. 9.

A node 905 of the storage capacitor is charged by the corresponding bit line. Node 905 includes metal layer plates or conductors coupled through vias 920. Node 905 is separated from an adjacent node 910 to form the capacitor. Node 910 may comprise corresponding metal layer plates coupled by vias as discussed with regard to node 905. In such an embodiment, node 910 would thus be tied to a desired voltage level such as ground. But as will explained further herein, a dramatic increase in capacitance may be achieved if signal-bearing conductors are used to form node 910. A resulting memory cell 1000 is illustrated in FIG. 10. An I/O access transistor couples a metal-layer storage capacitor 1001 to the corresponding bit line when the word line is raised. Signals 1 through 6 are carried on the various metal layers shown in FIG. 9. To realize the dramatic benefits of such a signal-bearing metal-layer capacitor (as opposed to a metal-layer capacitor in which node 910 has a fixed voltage), one or more of the signals needs to be controlled during a write operation. For example, suppose all signals 1 through 6 are raised to a power supply voltage (which may be either VDD or VIO level) while a zero is written into the memory cell. Because a power supply voltage difference ΔV exists across nodes 905 and 910 of the storage capacitor, the capacitor must store a charge Q as commanded by the well-known relationship Q=C*ΔV, where C is the capacitance of the metal-layer storage capacitor. Conversely, suppose signals 1 through 6 are grounded while a binary one is written into memory cell 1000. The same charge is stored but of opposite polarity. The difference in voltage for the signal lines between a logical zero and a logical one write operation may be denoted as a swing voltage. To read these binary states, signals 1 through 6 are raised to the power supply voltage. Thus, the binary states of zero and one are effectively separated by a voltage difference of 2*ΔV rather than just ΔV as would be the case if node 910 were maintained at a fixed voltage. It may be shown that the effective capacitance of the metal-layer storage capacitor is thus increased by a factor of (1+γ), where γ is proportional to a ratio of the swing voltage and the actual voltage difference written into the cell. Because of this multiplicative effect on the effective capacitance, an increase in capacitance of 2-3 times may be achieved as compared to a comparable metal-layer storage capacitor that uses a fixed voltage for node 910. Although this effective capacitive boosting has been described with regard to a metal-layer capacitor, it will be appreciated that this boosting may be applied to other DRAM capacitor structures such as trench capacitors or transistor-implemented capacitors. discussed. Referring back to FIG. 5, it may be appreciated that the memory cells are arranged in a grid-like fashion such that each memory cell may be considered to have a width W. Under foundry design rules, each metal layer conductor must be separated by a distance d. Thus, if the conductor used to form node 905 were confined within the width W allotted to each memory cell, it will have a maximum length of (W-d). To provide a greater length and thus capacitance, the conductors for node 905 in adjacent cells may be overlapped and staggered as shown in FIG. 11 for a first metal layer M1. In this fashion, the length of each conductor for node 905 may be extended to (2W-d). This pattern is repeated in metal layer 2 and so on. However, to optimize parasitic coupling, the pattern is rotated 90 degrees between each metal layer if possible under the routing circumstances. To minimize routing complications, the bit lines may be formed as diffusion regions in the substrate.

Referring back to FIG. 10, the access transistor may be formed in a hybrid memory wherein relatively-thin oxide (and lower voltage) core transistors are used to form the sense amplifier but the access transistor is formed as a thicker-oxide (and higher voltage) I/O transistor. As seen in FIG. 9, the drain of the access transistor is a diffusion region in the substrate that coupled to various metal layers to form part of a metal-layer storage capacitor. Because the memory cell (the storage capacitor and the access transistor) are formed as I/O devices, a relatively high power supply voltage (designated as VIO) may be used to charge the storage capacitor through the bit line. As discussed with regard to FIG. 7, the bit line is charged to the VIO voltage but is then level shifted so that the sense amplifier may be formed using higher-density core transistors. In this fashion, greater margins between binary one and zeroes are maintained than if the memory cell were merely charged to the core voltage VDD. If the memory cell is charged to VIO (storing a binary one in a logic high system) and the corresponding word line is inactive by being lowered to a ground potential VSS with the bit line being also grounded, a sub-threshold leakage current will flow through the access transistor into the bit line from the charged memory cell. This leakage current may lead to unacceptably low data retention times for the memory cell.

To minimize this leakage current, the word line may be biased with a negative charge pump 1002 if the bit line is grounded while the memory cell (and associated word line row) is in a default/inactive state. In that regard, it is known that drain-source current (designated as Ids) in a transistor is exponentially related to the gate-source voltage Vgs. For example, each reduction in Vgs by 100 mv may reduce leakage current by an order of magnitude. Thus, if charge pump 1002 biases the word line to a negative bias Vnn such as −0.4 V while the bit line is grounded during an inactive state for the memory cell, Vgs will be −0.4 V, which will produce a 10,000 fold reduction in leakage current as compared to a Vgs of 0.0 V. If a negative charge pump is unavailable (such as to address density concerns), the bit line should be biased at a minimum voltage (Vmin) such as 0.4V to maintain a negative Vgs.

A hybrid architecture increases the margin between binary one and zero decisions by the sense amplifier because the memory cell may be charged to the higher VIO power supply voltage rather than to the lower VDD core power supply. However, there will be a threshold voltage (Vt) drop across the access transistor such that the memory cell is merely charged to VIO minus Vt rather than VIO. To increase the margins between binary one and zero states, a positive charge pump 1010 may be used to bias the word line to a voltage Vpp equaling VIO plus Vt such that storage capacitor 1001 will be charged to the VIO potential rather than VIO minus Vt. It will be appreciated that it is presumed the access transistor are robust enough to accommodate the overdrive voltage Vpp in such embodiments.

It may thus be seen from the preceding discussion that a number of alternative hybrid memory architectures are available. These alternative embodiments may be summarized with regard to the following table 1:

Table 1 from their bit lines in these embodiments. In embodiment 3, the word line is biased to Vnn during idle states such that idle bit lines may be grounded (as well as the binary zero potential for the memory cells). In embodiment 4, the word line is not biased to Vnn such that the bit lines are biased to Vmin to keep Vgs negative for the access transistors during the idle states. In both embodiments 3 and 4, the word line is biased to VIO during active states such that the maximum voltage (binary one) charging the cells is VIO-Vt as discussed previously. In contrast, in embodiments 5 and 6, a positive charge pump biases the word line to Vpp such that the binary one memory cells may be charged to VIO. Embodiments 5 and 6 differ in that embodiment 5 has a negative charge pump whereas embodiment 6 doesn't.

Figure 12A:
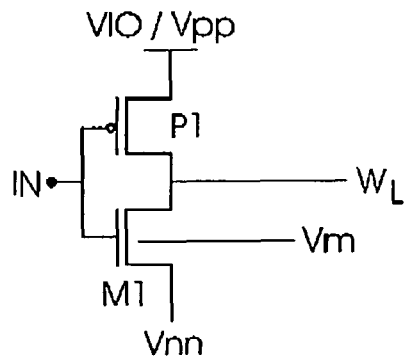
FIG. 12a is a schematic illustration of a wordline driver output stage.

The positive and negative charge pumps of FIG. 10 will couple to their word lines through word line drivers (not illustrated). A final word line driver stage is shown in FIG. 12*a*. An input signal in drives the gates of a PMOS transistor P1 and an NMOS transistor M1 that are coupled in series between Vnn (in negative charge pump embodiments) and a power supply node VIO (or a boosted power supply node Vpp in positive charge pump embodiments). The word line is tied to a node between P1 and M1 such that if input signal in is low, P1 will conduct to pull the word line high whereas if the input signal in is high, M1 will conduct to pull the word line to Vnn. Transistor M1 (as well as the access transistor of FIG. 10) should be placed in deep n-wells and their bodies tied to Vnn for embodiments in which the word line is biased to Vnn during idle states. By tying the transistor body to Vnn, the absolute value of Vnn need not be so large as compared to just tying the transistor body to ground because of the body effect from the negative voltage, which raises the threshold voltage Vt so as to further reduce leakage. If the body is tied to ground, there is no body effect to raise Vt such that the

TABLE 1

| | Word line idle | Word line active | Bit line inactive Cell "0" | Bit line "1" | Cell "1" |
|---|---|---|---|---|---|
| 1) | Vnn | VIO | 0 | VDD | min(VDD, VIO-Vt) |
| 2) | 0 | VIO | Vmin | VDD | min(VDD, VIO-Vt) |
| 3) | Vnn | VIO | 0 | VIO | VIO-Vt |
| 4) | 0 | VIO | Vmin | VIO | VIO-Vt |
| 5) | Vnn | Vpp | 0 | VIO | VIO |
| 6) | 0 | Vpp | Vmin | VIO | VIO |

In embodiments 1 and 2, the bit line is not charged to VIO during binary one write operations but instead remains at the core voltage VDD. In such embodiments, there would be no need for level-shifters between the sense amplifiers and the bit lines if the sense amplifier are constructed with core transistors. In embodiment 1, the word line is biased to the negative voltage Vnn during idle/inactive states such that the bit line inactive voltage (as well as the binary zero potential for the cell) may be zero volts. In embodiment 2, there is no negative charge pump available to produce Vnn. To maintain a sufficient negative Vgs on the access transistors in inactive rows, the corresponding bit lines are biased to a positive voltage Vmin as discussed above. The binary one memory cell voltage in both embodiments will be the smaller value of the voltage pair VDD and (VIO-Vt). In embodiments 3 and 4, the bit lines are charged to VIO during binary one writes such that level-shifters as discussed with regard to FIGS. 7 and 1 would isolate core-device-implemented sense amplifiers absolute value of Vnn must be increased to produce the same amount of leakage current reduction.

Figure 12B:
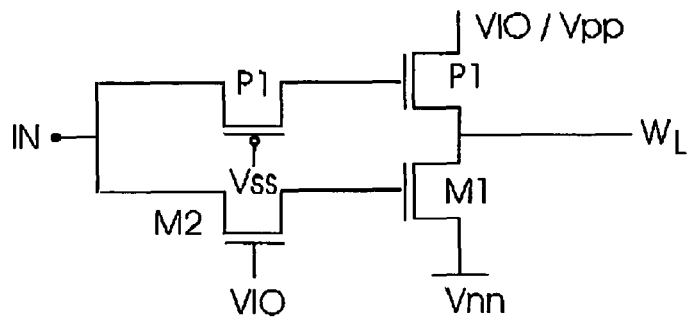
FIG. 12b is a schematic illustration of a wordline driver output stage modified to reduce a gate-source voltage stress.
Figure 12C:
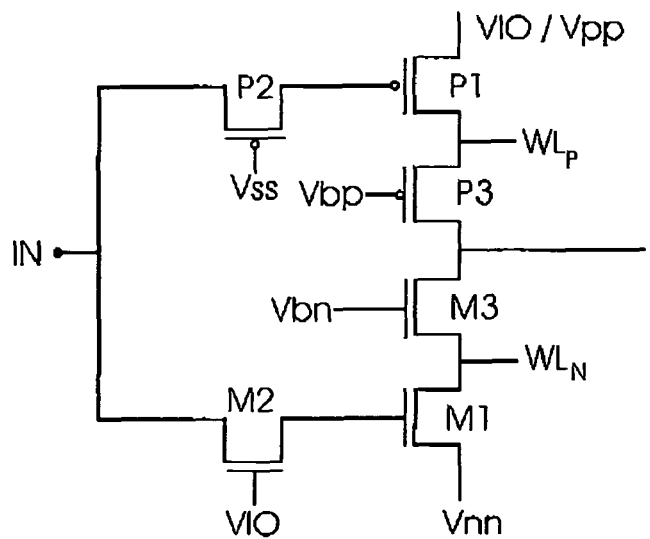
FIG. 12c is a schematic illustration of a wordline driver output stage modified to reduce a gate-source voltage stress as well as a drain-source voltage stress.

To minimize the stress within the wordline driver resulting from overdriving the access transistors with Vpp instead of VIO, the input signal in may be slowly ramped up or down slowly (as compared to the word line voltage change) so that transistors M1 and P1 do not experience a full Vgs of Vpp while the drain-to-source voltage Vds is also large. Turning now to FIG. 12*b*, the word line driver output stage may be altered by the addition of PMOS transistor P2 between the gate of P1 and an input node for the input signal in. Similarly, an NMOS transistor M2 may be inserted between the gate of M1 and the input node for input signal in. Each transistor P2 and M2 introduces a Vt voltage drop to reduce the Vgs stress on corresponding transistors P1 and M1. A similar modification to also reduce the drain-source voltage stress on transistors P1 and M1 is shown in FIG. 12*c*. Transistor P1 is isolated from the word line by a PMOS transistor P3 that is biased by a gate voltage Vbp. Similarly, transistor M1 is isolated from the word line by an NMOS transistor M3 that is biased by a gate voltage Vbn. The bias voltages Vbp and Vbm may be dynamically determined or may be pre-determined. It may be seen that a node WLp between P1 and P3 will charge to a voltage Vbp+Vt at a minimum whereas a node WLn between M1 and M3 will charge to a voltage Vbn−Vt at a maximum so as to reduce the drain-source voltage stress across transistors P1 and M1.

The above-described embodiments of the present invention are merely meant to be illustrative and not limiting. It will thus be obvious to those skilled in the art that various changes and modifications may be made without departing from this invention in its broader aspects. Therefore, the appended claims encompass all such changes and modifications as fall within the true spirit and scope of this invention.

We claim:

1. A hybrid DRAM, comprising:

a sense amplifier including a differential amplifier and regenerative latch, wherein the differential amplifier and regenerative latch are constructed using core transistors that have a relatively thin gate oxide; and a plurality of memory cells coupled to the sense amplifier through a pair of bit lines, wherein each memory cell includes an access transistor coupled to a storage capacitor, the access transistor having a relatively thick gate oxide, whereby the storage capacitor is capable of being charged to a VIO power supply voltage that is greater than a VDD power supply voltage for the core transistors.

* * * * *